US006608378B2

(12) United States Patent
Ahn et al.

(10) Patent No.: US 6,608,378 B2
(45) Date of Patent: Aug. 19, 2003

(54) FORMATION OF METAL OXIDE GATE DIELECTRIC

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/227,699

(22) Filed: Aug. 26, 2002

(65) Prior Publication Data

US 2003/0003702 A1 Jan. 2, 2003

Related U.S. Application Data

(62) Division of application No. 09/779,959, filed on Feb. 9, 2001, now Pat. No. 6,495,436.

(51) Int. Cl.$^7$ ................................. H01L 23/12
(52) U.S. Cl. ................. 257/701; 204/192.1; 204/192.32
(58) Field of Search ................. 257/701, 410; 204/192.1, 192.32

(56) References Cited

U.S. PATENT DOCUMENTS

| | | | |
|---|---|---|---|
| 4,759,948 A | 7/1988 | Hashimoto et al. | 427/38 |
| 4,793,908 A * | 12/1988 | Scott et al. | 204/192.26 |
| 4,933,058 A | 6/1990 | Bache et al. | 204/192.3 |
| 4,987,102 A | 1/1991 | Nguyen et al. | 437/238 |
| 5,055,169 A * | 10/1991 | Hock, Jr. et al. | 204/192.31 |
| 5,055,319 A | 10/1991 | Bunshah et al. | 427/38 |
| 5,122,483 A | 6/1992 | Sakai et al. | 437/238 |
| 5,250,327 A * | 10/1993 | Ogata et al. | 427/528 |
| 5,849,370 A | 12/1998 | Lee et al. | 427/562 |
| 6,020,243 A | 2/2000 | Wallace et al. | 438/287 |
| 6,144,057 A | 11/2000 | Yamazaki | 257/306 |
| 6,251,230 B1 * | 6/2001 | Honda et al. | 204/192.1 |
| 6,294,479 B1 * | 9/2001 | Ebe et al. | 438/758 |
| 2002/0111001 A1 | 8/2002 | Ahn et al. | 438/591 |

FOREIGN PATENT DOCUMENTS

| | | |
|---|---|---|
| EP | 0 269 112 | 6/1988 |
| EP | 0 468 758 | 1/1992 |
| EP | 0 565 766 | 10/1993 |
| EP | 0 570 618 | 11/1993 |
| JP | 63170244 | 7/1988 |
| JP | 03202468 | 9/1991 |
| WO | WO 98/55293 | 12/1998 |

OTHER PUBLICATIONS

Guo et al., "High Quality Ultra–thin (1.5nm) $TiO_2/Si_3N_4$ Gate Dielectric for Deep Sub–micron CMOS Technology," *IEEE Technical Digest of International Electron Devices Meeting*; 1999: 137–140.

Haraguchi et al., "A $TiO_2$ Gate Insulator of A 1–nm Equivalent Oxide Thickness Deposited by Electron–Beam Evaporation," *Extended Abstracts of 1999 International Conference on Solid State Devices and Materials*, Tokyo, Japan; Sep. 21–24, 1999: 376–377.

Lee et al., "Ultrathin Hafnium Oxide with Low Leakage and Excellent Reliability for Alternative Gate Dielectric Application," *IEEE Technical Digest of International Electron Devices Meeting*; 1999:133–136.

Lee et al., "Ion–assisted deposition of silver thin films," *Thin Solid Films*; 2000; 359(1): 95–97.

Luan et al., "High Quality $Ta_2O_5$ Gate Dielectrics and $T_{ox,eq}$<10 Å," *IEEE Technical Digest of International Electron Devices Meeting*; 1999: 141–142.

Martin et al., "Ion–beam–assisted deposition of thin films," *Applied Optics*; 1983; 22(1): 178–184.

Souche et al., "Visible and infrared ellipsometry study of ion assisted $SiO_2$ films," *Thin Solid Films*; 1998; *313–314*: 676–681.

* cited by examiner

*Primary Examiner*—Hoai Ho
*Assistant Examiner*—Quoc Hoang
(74) *Attorney, Agent, or Firm*—Mueting, Raasch & Gebhardt, P.A.

(57) ABSTRACT

Formation of a gate dielectric includes forming a metal oxide on at least a portion of the surface of the substrate assembly by electron beam evaporation. An ion beam is generated using an inert gas to provide inert gas ions for compacting the metal oxide during formation thereof.

10 Claims, 4 Drawing Sheets

FORMATION OF METAL OXIDE GATE DIELECTRIC

This is a division of application Ser. No. 09/779,959, filed Feb. 9, 2001, now U.S. Pat. No. 6,495,436, which is incorporated herein by reference.

FIELD OF THE INVENTION

This invention relates to semiconductor fabrication methods and apparatus for implementing such methods. More particularly, the present invention relates to metal oxide gate structures for semiconductor devices, e.g., MOSFET devices, memory devices, etc., and other structures including metal oxide dielectric material.

BACKGROUND OF THE INVENTION

Semiconductor devices such as field effect transistors are commonly used in the electronics industry. Such devices may be formed with extremely small dimensions, such that thousands or even millions of these devices may be formed on a single crystal silicon substrate or "chip" and interconnected to perform useful functions in an integrated circuit such as a microprocessor, a memory device, etc. For example, metal oxide semiconductor (MOS) devices are widely used in memory devices that comprise an array of memory cells that include field effect transistors and capacitive structures.

Although transistor design and fabrication are generally complex, a simplified field effect transistor is described below. In such a field effect transistor, a portion of a substrate near the surface is designated as a channel of the transistor. The channel is electrically connected to a source and a drain such that when a voltage difference exists between the source and the drain, current will tend to flow through the channel. The semiconducting characteristics of the channel are altered such that its resistivity may be controlled by the voltage applied to a gate, which generally includes a conductive layer or gate electrode overlying the channel. By changing the voltage on the gate, more or less current can be made to flow through the channel. The gate electrode and the channel are separated by a gate dielectric. Generally, the gate dielectric is insulating, such that between the gate and channel little or no current flows during operation, although tunneling currents observed within certain dielectrics. The gate dielectric allows the gate voltage to induce an electric field in the channel.

Generally, integrated circuit performance may be enhanced by scaling. In other words, performance and density are enhanced by decreasing the size of the individual semiconductor devices on the chip. This has been accomplished by decreasing the thickness of the gate dielectric, thus bringing the gate in closer proximity to the channel. As modern silicon device size becomes smaller or has been scaled to smaller and smaller dimensions, with a corresponding size reduction of the gate length of MOS devices, the gate dielectric thickness has continued to decrease, for example, to less than 2 nm (20 Å) and as thin as 1 nm (10 Å).

However, the most commonly used gate dielectric material, silicon dioxide, exhibits high leakage current density in this thickness range because of direct band-to-band tunneling current or Fowler-Nordheim tunneling current. Further, because such silicon dioxide layers are formed from a few layers of atoms, complex process control is required to repeatably produce such silicon dioxide layers. Further, uniformity of coverage is also critical because device parameters may change dramatically based on the presence or absence of even a single monolayer of dielectric material. Because of the limitations of silicon dioxide, alternative high dielectric constant (K) films such as $TiO_2$, $Ta_2O_5$, $HfO_2$, and other high dielectric films have received a lot of interest as substitutions for very thin silicon dioxide gate dielectrics. Such alternate dielectric materials can be formed in a thicker layer than silicon dioxide and yet still produce the same field effect performance. Such performance is often expressed as "equivalent oxide thickness." In other words, although the alternate material layer may be thick, it has the equivalent effect of a much thinner layer of silicon dioxide. Most of the interest in alternate materials for silicon dioxide have employed the use of metal oxides.

Various methods have been described for the formation of metal oxides, e.g., formation of metal oxide gate dielectrics. For example, in Haraguchi et al., "A $TiO_2$ Gate Insulator of a 1-nm Equivalent Oxide Thickness Deposited by Electron-Beam Evaporation," *Extended Abstracts of 1999 International Conference on Solid State Devices and Materials*, pps. 376–377 (1999), fabrication of thin dielectric films by electron beam evaporation was described. As described in Haraguchi et al., one of the more common methods of forming metal oxide films, e.g., titanium dioxide ($TiO_2$), is by chemical vapor deposition. However, for example, impurities such as carbon and chlorine originating from titanium precursors in such chemical vapor deposition processes may cause undesirable influence on the $TiO_2$ film properties. To achieve the preparation of high purity $TiO_2$ films, electron beam evaporation (as described in Haraguchi et al.) has been used instead of chemical vapor deposition.

For example, as described in Haraguchi et al., electron beam evaporation for forming metal oxides was performed in the ambient of ozone plasma minimizing the effect of oxygen depletion, resulting in pure $TiO_2$ films. Further, by optimizing $TiO_2$ deposition thickness and $TiO_2$ annealing conditions, $TiO_2$ films with 1 nm equivalent oxide thickness which showed low leakage current and interface trap density were realized.

However, even though electron beam evaporation methods have been found to produce metal oxides which show low leakage current and have suitable equivalent oxide thickness, optimization of such film formation processes are necessary. The optical properties for most vacuum evaporated thin films change when the films are exposed to moisture, and they are unstable in air since the properties are dependent on the relative humidity. Such properties are attributed to microstructure of the films, which have been reported to include approximately cylindrical columns several tens of nanometers in diameter with voids between them. As a result, the density of the films is less than that of the bulk material. Upon contact with the moisture, the internal surfaces of the columns adsorb a monolayer of water. On exposure to a humid atmosphere, the voids act as capillaries and fill with water, upon bringing the relative humidity above a certain threshold, which depends upon the diameter of the pores. Consequently, the refractive indices of the films when deposited are less than those of the bulk material and change when the film is exposed to a humid atmosphere. The extent of the change is dependent upon the relative humidity. Typical packing densities for such films have been found to be between 0.75 to 1.0.

Higher packing densities for films and, hence, increased stability were reported to be achieved as described in an article by Martin et al., "Ion-beam-assisted deposition of thin films," *Applied Optics*, Vol. 22, No. 1 (Jan. 1, 1983), where the adatoms had greater mobility on the substrate surface. The article indicates they can be produced by heating a substrate or by increasing the energy of the arriving atoms or molecules as occurs in sputtering or ion beam deposition. Additional activation energy can be added to the growing film if it is bombarded with low energy ions during deposition, as reported therein.

In addition, an article by Souche et al., entitled "Visible and infrared ellipsometry study of ion assisted $SiO_2$ films," *Thin Solid Films*, Vol. 313–314, pps. 676–681 (1998), described the study of oxygen ion-assisted silica thin films by means of in situ visible spectroscopic ellipsometry and infrared spectroscopic ellipsometry in air. The article discusses the transition from porous evaporated films to compact films, with emphasis on compaction of silicon dioxide films by ion-assisted deposition.

Further, ion-assisted deposition of silver thin films was described in an article by Lee et al., entitled "Ion-assisted deposition of silver thin films," *Thin Solid Films*, Vol. 359, pps. 95–97 (2000). The article describes silver films deposited with ion bombardment which are more durable in a humid environment and maintain a higher value of reflectance over time than those deposited without ion bombardment. The effects of ion bombardment was found to reduce the surface roughness and increase the film density. Further, the hardness of the films increased. Yet further, the article described the finding that lattice spacing increased.

SUMMARY OF THE INVENTION

The present invention optimizes the formation of high dielectric films using electron beam evaporation. For example, the present invention optimizes such evaporation processes with the use of high purity source materials, use of ion beam bombardment techniques, use of an ozone environment, etc.

A method for use in fabrication of a gate structure according to the present invention includes providing a substrate assembly having a surface located in a vacuum chamber and forming a gate dielectric on the surface. The formation of the gate dielectric comprises forming a metal oxide on at least a portion of the surface of the substrate assembly by electron beam evaporation and generating an ion beam using an inert gas to provide inert gas ions for contacting the metal oxide during formation thereof.

In one embodiment of the method, an environment including oxygen may be provided in the vacuum chamber. The formation of the metal oxide occurs in the oxygen environment. For example, the environment provided may be an ozone environment in the vacuum chamber and/or an ozonizer structure proximate the substrate assembly surface may be used to direct ozone towards the substrate assembly surface.

In other embodiments of the method, the method may include heating the substrate assembly as the metal oxide is formed and/or delaying contact of the inert gas ions with the metal oxide until at least a monolayer of metal oxide is formed.

A method for use in fabrication of a gate structure according to the present invention includes providing a substrate assembly having a surface located in a vacuum chamber and forming a gate dielectric on the surface. The formation of the gate dielectric includes providing an environment including ozone in the vacuum chamber, forming $TiO_2$ on at least a portion of the surface of the substrate assembly by electron beam evaporation in the environment including ozone, and generating an ion beam using an inert gas to provide inert gas ions for contacting the $TiO_2$ during formation thereof.

In one embodiment of the method, forming $TiO_2$ on at least the portion of the surface of the substrate assembly by electron beam evaporation includes directing an electron beam at a high purity $TiO_2$ source material. The high purity source material has a purity of $TiO_2$ that is about 99.999% or greater.

In another embodiment of the method, forming $TiO_2$ on at least the portion of the surface of the substrate assembly by electron beam evaporation includes directing an electron beam at the high purity $TiO_2$ source material such that a deposition rate for $TiO_2$ on the surface of the substrate assembly is about 0.1 nm/second to about 0.2 nm/second.

In other embodiments of the method, forming $TiO_2$ on at least a portion of the surface of the substrate assembly may include forming $TiO_2$ directly on at least a silicon containing portion of the surface of the substrate assembly and/or the method may include forming a conductive gate electrode on the gate dielectric.

Another method for forming a high dielectric constant metal oxide in the fabrication of integrated circuits is described. The method includes providing a substrate assembly having a surface located in a vacuum chamber and forming a metal oxide on at least a portion of the surface of the substrate assembly by evaporating a metal oxide source material using an electron beam. Contact of inert ions with the metal oxide is provided during formation thereof.

In other embodiments of the method, the metal oxide may be at least a portion of a gate dielectric or the metal oxide may be at least a portion of a dielectric material for a capacitor.

A system for use in the fabrication of a gate structure according to the present invention includes a vacuum chamber including a substrate assembly holder adapted to hold a substrate assembly having a surface and an ozonizer apparatus. The ozonizer apparatus includes an ozone source and an ozonizer structure proximate the surface of the substrate assembly in the vacuum chamber. The ozonizer structure has openings adapted to direct ozone towards the surface of the substrate assembly. The system further includes an evaporation apparatus. The evaporation apparatus includes a metal oxide source and an electron beam generation device operable to generate an electron beam that impinges on the metal oxide source to evaporate metal oxide of the metal oxide source for formation of metal oxide on the surface of the substrate assembly. Yet further, the system includes an ion beam apparatus. The ion beam apparatus includes an inert gas source operable to provide an inert gas and an ion gun operable to generate an ion beam using the inert gas and directing the ion beam for contact at the surface of the substrate assembly.

In various embodiments of the system, the metal oxide source may include a high purity source material (e.g., a purity that is about 99.999% or greater); the metal oxide source may include material selected from the group consisting of $TiO_2$, $Y_2O_3$, $Al_2O_3$, $ZrO_2$, $HfO_2$, $Y_2O_3$—$ZrO_2$, $ZrSiO_4$, $LaAlO_3$, and $MgAl_2O_4$; and/or apparatus may include a controller operable to delay generation of the ion beam until at least a monolayer of metal oxide is formed using the evaporation apparatus.

DETAILED DESCRIPTION OF THE EMBODIMENTS

Figure 1:
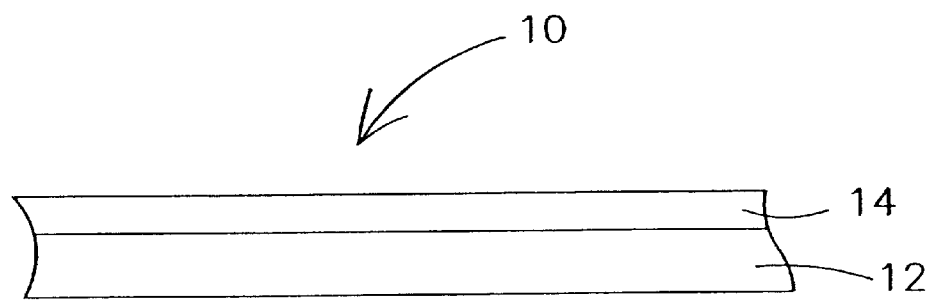
FIG. 1 shows a structure including a metal oxide formed according to the present invention.

The present invention shall be described with reference to FIGS. 1–3. FIG. 1 and FIGS. 2A–2C shall be used to describe the process of forming metal oxide according to the present invention, e.g., metal oxide gate dielectric, while the apparatus for forming a metal oxide shall be described with reference to FIG. 3. With the description as provided below, it is readily apparent to one skilled in the art that the various processes and the steps thereof described with reference to the figures may be utilized in various configurations and/or applications. For example, the present invention may be used in the formation of gate dielectrics, dielectrics for capacitors, or for any other applications requiring a dielectric or insulating material. Further, for example, the present invention may be particularly beneficial in the fabrication of gate dielectrics for transistor applications in memory devices, e.g., DRAMs.

In this application, "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate or the semiconductor substrate having one or more layers or structures formed thereon or regions formed therein. When reference is made to a substrate assembly in the following description, various process steps may have been previously utilized to form regions/junctions in the semiconductor substrate thereof. It should be apparent that scaling in the figures does not represent precise dimensions of the various elements illustrated therein.

Further, as used herein, "high dielectric constant" refers to a dielectric constant greater than 3, and preferably greater than 10. Also as used herein, the term "deposition temperature" will typically refer to the surface temperature of the substrate assembly or layer upon which a material is being deposited; the term "flow rate" as used herein in connection with gas flow rates will typically refer to the gas flow rate provided to a particular component or portion of a system according to the present invention; and the term "deposition pressure" will typically refer to the pressure within the chamber wherein the substrate assembly or layer upon which a material is being deposited is positioned.

FIG. 1 shows a structure 10 including a substrate assembly 12 upon which a metal oxide 14 is formed. The substrate assembly 12 may be either a semiconductor substrate or a semiconductor substrate having one or more layers, structures, or regions formed thereon or therein. For example, in one preferred embodiment wherein the metal oxide 14 is used to form a gate dielectric as shown in FIGS. 2A–2C, the substrate assembly 12 is a silicon substrate.

The metal oxide 14 may be any high dielectric metal oxide. Preferably, the metal oxide includes at least one of $TiO_2$, $Y_2O_3$, $Al_2O_3$, $ZrO_2$, $HfO_2$, $Y_2O_3$—$ZrO_2$, $ZrSiO_4$, $LaAlO_3$, or $MgAl_2O_4$. More preferably, the metal oxide is $TiO_2$. Although the present invention may be beneficial in forming any of the high dielectric constant materials listed above, for simplicity purposes, and preferably, the remainder of the description below is provided with respect to the formation of $TiO_2$, e.g., formation of $TiO_2$ for a gate dielectric.

In addition, the present invention will primarily be described with reference to the formation of a metal oxide for a gate dielectric as described with reference to FIGS. 2A–2C. However, the metal oxide may be used for any other application as shown generally with reference to FIG. 1 wherein the substrate assembly 12 may be either a semiconductor substrate or, for example, a semiconductor substrate assembly including an electrode region upon which a metal oxide is formed, e.g., a capacitor application.

Figure 2A:
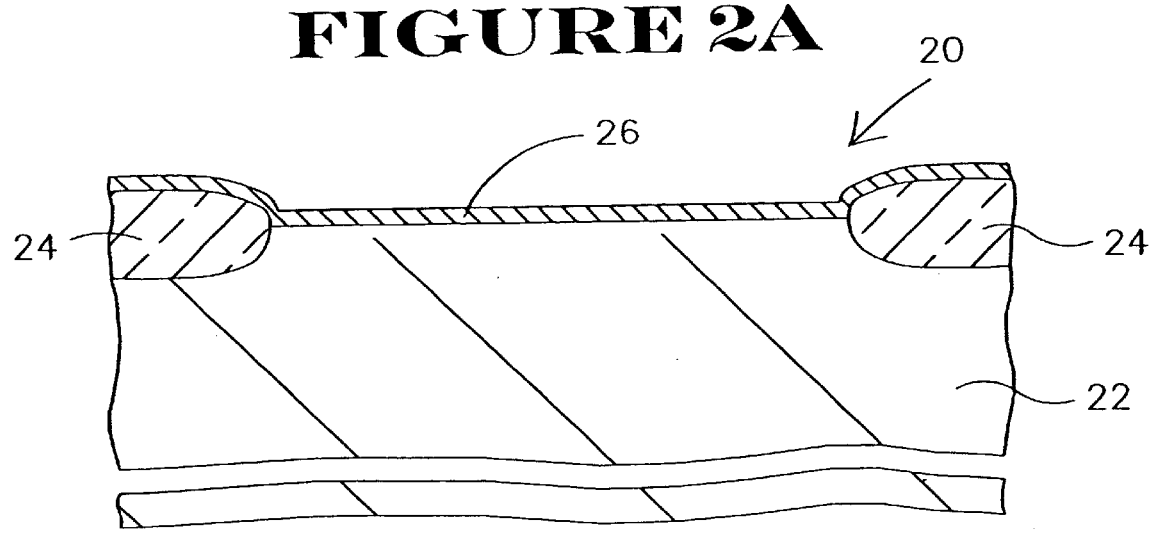
FIGS. 2A–2C show a process for forming a gate using a high dielectric constant metal oxide gate dielectric formed according to the present invention.
Figure 2B:
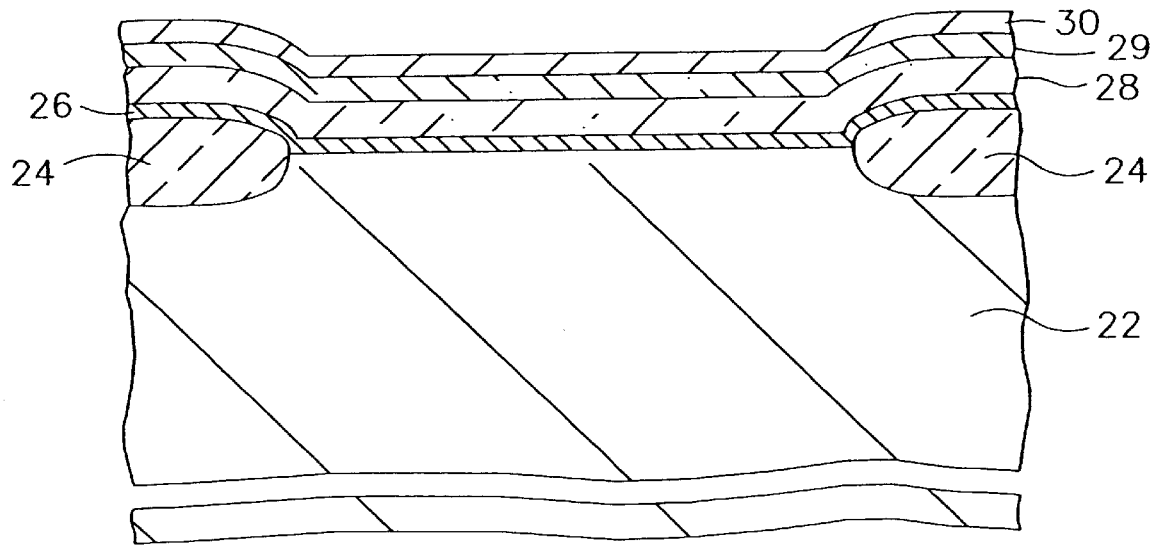
Figure 2C:
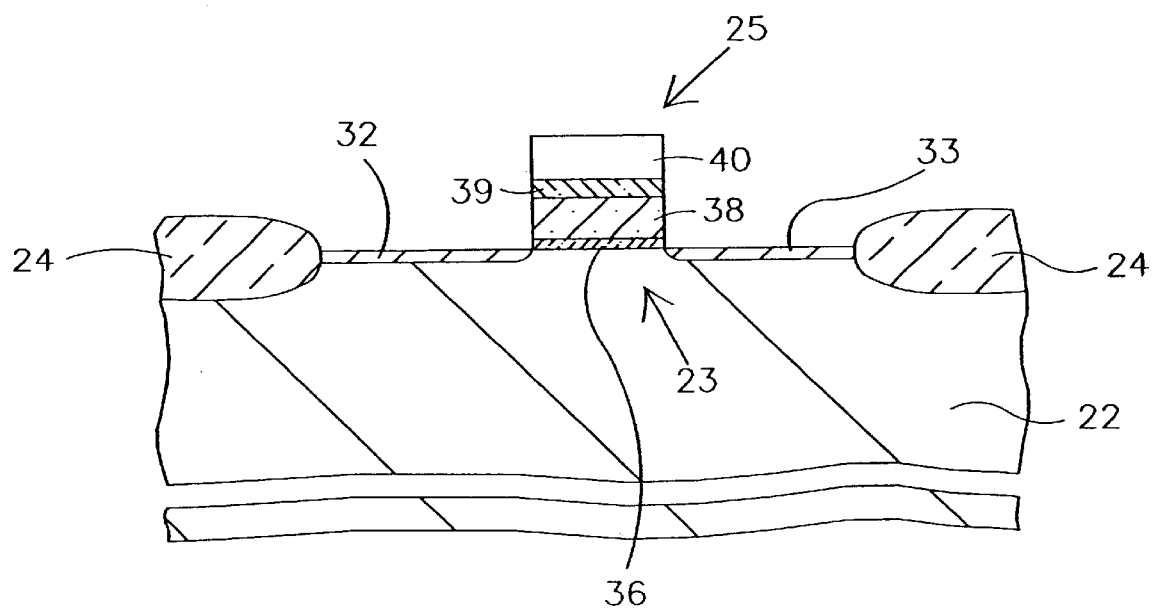

As shown in FIGS. 2A–2C, a simplified flow process for forming a gate 25 (see FIG. 2C) is shown. In FIG. 2A, a device structure 20 is fabricated in accordance with conventional processing techniques prior to the formation of metal oxide 26 on the device structure 20. As such, prior to the formation of the metal oxide 26, the device structure 20 includes field oxide regions 24 and active areas, i.e., those regions of a substrate 22 not covered by field oxide regions 24. Suitably doped source/drain regions 32–33, as shown in FIG. 2C, are formed as known to one skilled in the art.

As shown in FIG. 2A, metal oxide 26 is formed over the field oxide regions 24 and semiconductor substrate 22 as described further below. In addition, as shown in FIG. 2B, various other layers 28–30 may be used to form a conductive gate electrode relative to the gate dielectric 26. For example, as shown in FIG. 2B, three layers 28–30 are formed and thereafter, as shown in FIG. 2C, the gate dielectric and the multiple conductive layers 28–30 are patterned resulting in gate dielectric 36 and gate electrode layers 38–40 to form the gate 25. Various techniques for patterning the layers, e.g., removing unmasked regions, are know to those skilled in the art and the present invention is not limited to any particular technique.

As known to one skilled in the art, in a field effect transistor, a portion of the substrate 22 near the surface is designated as a channel 23 during processing. Channel 23 is electrically connected to source/drain 32–33 such that when a voltage difference exists between the source/drain, current will tend to flow through the channel 23. The semiconducting characteristics of channel. 23 are altered such that its resistivity may be controlled by the voltage applied to gate 25. Thus, by changing the voltage on gate 25, more or less current can be made to flow through channel 23. The conductive gate components 38–40 and channel 23 are separated by gate dielectric 36. The metal oxide gate dielectric 36 is insulative such that between the conductive gate components 38–40 and channel 23 little or no current flows during operation. However, the metal oxide gate dielectric 36 allows the gate voltage to induce an electric field in channel 23. After formation of the gate 25, various processing techniques, such as, for example, metalization techniques used for providing electrical connection to the source/drain 32, 33 and the gate 25, are used to complete formation of, for example, the complete transistor device, interconnect levels, memory device structures including capacitive structures formed thereafter, etc.

It will be readily apparent that the present invention is focused on the formation of the metal oxide gate dielectric 36 and the other steps utilized therewith may be those known to one skilled in the art. For example, various manners of doping the source and drain may be used, one or more layers may be used for formation of the conductive gate electrode portion of gate 25 (e.g., polycide structures, silicide layers, etc.), various silicidation processes or salicidation may be used for metalization of the various regions, etc., without limiting the process of forming the metal oxide gate electrode 36.

For simplicity purposes, the remainder of the description below shall be limited to the formation of the metal oxide 26, with the metal oxide 26 preferably being $TiO_2$. Generally, the present invention forms $TiO_2$ by electron beam evaporation from a $TiO_2$ source, e.g., high purity $TiO_2$ slug, in a vacuum chamber in the presence of an ion beam. Preferably, the $TiO_2$ is formed on a heated substrate assembly, and also in the presence of an oxygen atmosphere, e.g., $O_2$ or ozone. The presence of an ion beam during deposition of the metal oxide by evaporation enhances the packing density and makes the metal oxide more reliable in terms of dielectric breakdown and reducing tunneling current. The metal oxide film produced provides an adequate equivalent oxide thickness, with the metal oxide thickness of the material formed being in the range of about 50 Å to about 500 Å. Since tunneling currents are exponential functions of electric fields, the thicker films of $TiO_2$ will result in much lower electric fields and insignificant tunneling currents when compared to the use of silicon dioxide.

The formation of $TiO_2$ according to the present invention shall be further described with reference to the metal oxide evaporation system 50 shown in FIG. 3.

The metal oxide evaporation system 50 includes a vacuum chamber 52 in which a substrate assembly, e.g., wafer 62, is positioned and held by substrate holder 64. The substrate assembly, e.g., wafer 62, may be any substrate assembly as previously described herein and it may be held in the vacuum chamber 52 by any suitable substrate holder, e.g., electrical or mechanical coupling structures.

The metal oxide evaporation system 50 further includes a heater apparatus 66 for heating the substrate assembly 62 as the metal oxide 26 is formed. The evaporation system 50 further includes electron beam evaporation apparatus 74 in which a stream of electrons is accelerated to a high energy and directed at source material 106 to be evaporated. The electron stream melts and evaporates the material 106 for deposition of the metal oxide on surface 63 of substrate assembly 62.

In addition, the evaporation system 50 includes ion beam apparatus 78 and ozonizer apparatus 76. The ion beam apparatus 78 provides for the generation of an ion beam using an inert gas to provide inert gas ions for contacting, e.g., such as for compacting, the metal oxide during formation thereof. The ozonizer apparatus 76 compensates for the loss of oxygen in the deposited $TiO_2$.

Further, included in the metal oxide evaporation system 50, is a shutter 80, e.g., a mechanical shutter, located between the substrate assembly 62 and electron beam evaporation apparatus 74. In addition, a monitoring apparatus 82, e.g., a quartz crystal thickness monitor, is further provided as described below.

The heater apparatus 66 may be any apparatus suitable for heating the substrate assembly 62. Preferably, for the formation of $TiO_2$, the substrate assembly temperature is between about 100° C. to about 150° C. As shown in FIG. 3, one suitable embodiment of the heater apparatus 66 includes a heating element 68 surrounded by a heat reflector 70 for reflecting heat to the substrate assembly 62.

The electron beam evaporation apparatus 74 generally includes an electron beam gun 104 for generating an electron beam 102 directed at an evaporant source 106 to melt evaporant material thereof. Generally, the electron beam 102 can melt and evaporate material of source 106, provided the beam 102 can supply energy to the evaporant at an equal or greater rate than the rate at which heat is lost as the material is held at high temperature. Electron beam guns are available that supply up to 10 kilowatts of highly concentrated electron beam power for evaporation applications. Very high film deposition rates can thereby be attained as a result of the high power available. The electron beam evaporation apparatus 74 further includes a controller 108, shown generally in FIG. 3, for controlling operation of the electron gun 104 and evaporation process. Preferably, the controller 108 adjusts the electron gun power such that the gun will yield a deposition rate of about 0.1 nm/sec to 1.0 nm/sec when used in forming metal oxides according to the present invention, particularly with respect to $TiO_2$.

The beam energy is concentrated on the surface of the evaporant source 106, and thus, a molten region can be supported by a cooled structure. The target material, or evaporant source itself, typically provides a solid layer that separates the molten portion of the evaporant material from a holder, e.g., a crucible, that is cooled. This eliminates the problem of reaction with or dissolution of the holder by the melt and allows highly pure films to be deposited. This holder is typically copper, which has a high melting temperature.

Preferably, the evaporant source 106 includes high purity metal oxide. As used herein, high purity metal oxide refers to a metal oxide having a purity that is about 99.999% or greater. For example, in one preferred embodiment, the evaporant source 106 includes $TiO_2$ that is greater than about 99.999% pure.

The electron beam gun 104 is generally a self-accelerating, 270° beam gun that is generally a standard design and commonly available. In such guns, a magnetic field simultaneously bends the beam 102 to 270° and focuses the beam on the evaporant source 106. The electron emission surface is hidden from the evaporating source 106, and the substrates are also protected from contamination by material evaporating from the heated filament of the gun. Movement of the beam 102, which allows the evaporant source to be scanned, may be accomplished by electromagnetic deflection. This avoids the problem of non-uniform deposition that may be caused by the formation of a cavity in the molten evaporant source if the beam 102 were stationary. Although various preferred parameters are given for the electron beam gun 104 as described above, any suitable electron beam gun may be used according to the present invention, e.g., a Temescal electron beam gun).

The ion beam apparatus 78 which provides for bombardment of the substrate assembly surface 63 uniformly during metal oxide formation includes an ion gun 120, an ion gas source 122, and an ion beam controller 124. The ion beam apparatus 78 provides for compacting of the metal oxide formed on the surface 63 of substrate assembly 62.

The ion gas source 122 may be any inert gas. As referred to herein, inert means any gas that is nonreactive with the materials being deposited. Preferably, the ion gas source includes at least one of argon, xenon, and krypton. More preferably, the ion gas source is argon.

The ion gun 120 may be any suitable type of ion gun that provides for compaction of the metal oxide being formed, such as a Kaufman-type ion gun. Ion guns are commonly available, such as those available from Applied Materials, Inc. Preferably, the ion beam incident angle ($\alpha$) is within the range of +40 degrees to about –40 degrees relative to the surface 63 as shown in FIG. 3. Further preferably, the ion beam gun 120 is an ion gun with a fairly large diameter. Preferably, the diameter is in the range of 7.6 cm to 10 cm. Yet further, the ion gun is preferably a filament-type gun which uses a hot filament to ionize the gas from gas source 122. A filament-type ion gun is preferred over a cold catheter discharge ion gun.

The ion beam gun 120 is controlled by controller 124 to produce an ion beam density for bombardment of the material being formed on surface 63. Preferably, the ion beam density is in the range of about 0.5 ma/cm$^2$ to about 1.0 ma/cm$^2$. An ion beam density in this range is generally required to obtain a suitable degree of compaction by the bombardment of ions on substrate assembly surface 63 as the metal oxide is being formed.

In addition to the use of the electron beam evaporation apparatus 74 and the ion beam apparatus 78 in the formation of metal oxide on surface 63 of substrate assembly 62 mounted in the reaction chamber 52, the ozonizer apparatus 76 provides the necessary oxygen to compensate for any loss of oxygen in the evaporated metal oxide. The ozonizer apparatus 76, as shown in FIG. 3, includes the ozonizer structure 132 for providing ozone into the vacuum chamber 52 from the ozone source 130 under the control of controller 136. Although the vacuum chamber 52 may be flooded with oxygen, e.g., $O_2$ or $O_3$, the ozonizer structure 132 is preferably adapted to direct ozone towards the surface 63 of the substrate assembly 62 upon which the metal oxide is deposited. This maintains the ozone in the region of formation of the metal oxide on the surface 63 and provides for uniform distribution of ozone in this region.

Figure 3:
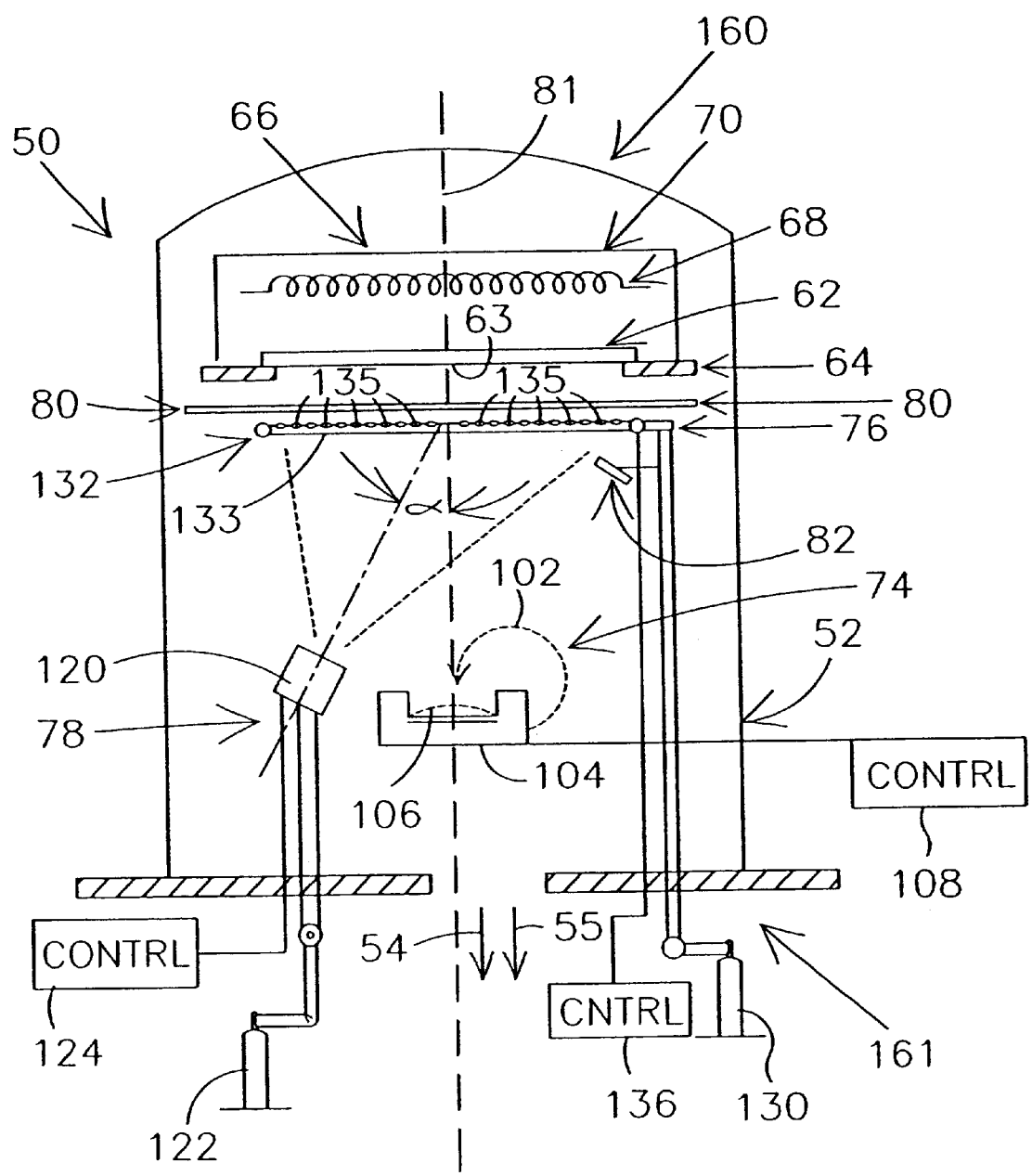
FIG. 3 shows a general diagram of an apparatus for formation of high dielectric constant metal oxide according to the present invention.

Preferably, according to the present invention as shown in FIG. 3, the ozonizer structure 132 includes a ring 133 with center axis 81 therethrough. The ring 133 has a plurality of openings 135 adapted to direct ozone towards the surface 63 of the substrate assembly 62. The ring 133 having the openings 135 enhance the uniform distribution of ozone in the region of the surface 63. The ozonizer ring 133 is positioned generally parallel with the substrate assembly 62, e.g., semiconductor wafer, with the openings 135 adapted for directing ozone towards the surface 63. The ozonizer ring 133 is generally of a size that does not inhibit the ion beam generated by the ion beam gun 120 from bombardment of the surface 63 as the metal oxide is formed.

The metal oxide evaporation system 50 further includes a shutter 80, e.g., a mechanical shutter, located between the substrate assembly 62 and the electron beam gun 104 in the vacuum chamber 52. The shutter 80 is employed to prevent contaminants absorbed on the evaporant source surface from being incorporated into deposited metal oxide. In other words, if the vacuum chamber and the evaporant source are exposed to ambient conditions in the loading and unloading of substrate assemblies, e.g.,wafers, some contamination may occur on the evaporant source. Therefore, when the source is initially heated, such surface contaminants may vaporize together with source material and, as such, contaminate the metal oxide formed on surface 63. By interposing the shutter between the evaporant source 106 and the surface 63 and postponing formation of the metal oxide until the evaporant source 106 is sufficiently clean, the purity of the formed metal oxide can be enhanced.

Further included in the vacuum chamber 52 is monitoring apparatus 82 which monitors the metal oxide thickness being formed on substrate surface 63. Further, incorporation of oxygen in the film may also be monitored. Various types of monitoring apparatus 82 may be used, such as a quartz crystal thickness monitor or an oxygen pressure monitor for monitoring oxygen incorporation. Such monitoring may provide information to one or more of the controllers of the system 50. For example, the concentration of ozone in the vacuum chamber 52 may be controlled by monitoring the oxygen content in the film using monitoring apparatus 82 and adjusting, via controller 136, the ozone in the region proximate the surface 63 of substrate assembly 62. Likewise, the deposition rate may be adjusted under control of controller 108 as a result of information available from monitoring apparatus 82, concerning the thickness of the metal oxide being formed on surface 63. Although several monitoring devices are described above, the present invention is not limited to those listed.

Generally, as shown in FIG. 3, the vacuum chamber 52 includes an elongated chamber space extending between a first end 160 and a second end 161 along axis 81. The electron beam gun 104 is centrally located toward the bottom or second end 161 of the vacuum chamber 52. The substrate assembly holder 64 which holds the substrate assembly 62 is surrounded by the heater apparatus 66 at the first end 160 of the vacuum chamber 52. Proximate the substrate assembly 62 is the ozonizer ring 133 with the small openings 135 directed to the substrate assembly 62 for uniform distribution of ozone, particularly to compensate for loss of oxygen in an evaporated $TiO_2$ film. The shutter 80 is located between the substrate assembly 62 and the ozonizer ring 133. The ion beam gun 120 is located generally towards the substrate assembly 62 relative to the ion electron beam gun 104 and slightly off axis from the center location of the electron beam gun 104.

Generally, the method of forming metal oxide using, for example, the evaporation system 50 described with reference to FIG. 3 shall be described below. The description of the formation method below is provided with respect to $TiO_2$ formation, however, the general concepts employed in the formation method are applicable to the other high dielectric constant materials as listed previously herein.

The vacuum chamber 52 is pumped down to a pressure in the range of about $2 \times 10^{-6}$ torr to about $8 \times 10^{-6}$ torr as generally represented by arrow 54. The heater apparatus 66 is controlled to provide a deposition temperature of about 100° C. to about 150° C. The evaporant source 106 is a high purity $TiO_2$ slug.

The controller 108 initializes the evaporation process. Although the ion beam gun 120 may be initiated by controller 124 simultaneously with the electron beam evaporation apparatus 74, preferably, the introduction of the ion beam used to bombard the substrate assembly surface 63 during the metal oxide formation from the evaporation of the evaporant source 106 is delayed for a predetermined period of time to allow deposition of at least one monolayer of the metal oxide, e.g., $TiO_2$. This provides protection in the case of a silicon substrate surface 63 from possible damage caused by the ion beam bombardment. Preferably, the electron beam gun power is adjusted such that the gun will yield a deposition rate of about 0.1 nm/sec to 1.0 nm/sec.

Further, preferably, the ion beam apparatus 78 provides an argon ion beam density in the range of about 0.5 ma/cm$^2$ to 1 ma/cm$^2$. However, as described above, preferably, the ion beam is delayed following initialization of the evaporation apparatus for a period of time, e.g., approximately 1–2 seconds, to allow deposition of at least one monolayer of $TiO_2$.

Further, upon initialization of the evaporation apparatus 74, a pre-evaporation phase is completed during which shutter 80 is closed, preventing formation of metal oxide on surface 63. During the pre-evaporation phase, outgasses resulting from evaporation during the pre-evaporation phase are exhausted, as is generally represented by arrow 55. As such, contaminants which potentially may contaminate the metal oxide film being formed are removed during the pre-evaporation phase.

Following the pre-evaporation phase, the shutter 80 is opened to allow formation of the metal oxide on surface 63.

Preferably, only after at least a monolayer of $TiO_2$ is formed is the argon beam initiated to provide for compaction during the remaining formation of the $TiO_2$.

During formation of the $TiO_2$ on surface 63, the partial pressure of ozone provided by the ozonizer apparatus 76 in the vacuum chamber 52 is in the range of about $2 \times 10^{-5}$ torr about $8 \times 10^{-5}$ torr. The optimum parameters for the ozone in the region proximate the substrate assembly 62 is or may be determined by monitoring the oxygen content in the metal oxide being formed as represented generally by the monitoring apparatus 82.

Use of the ion bombardment of the substrate assembly surface 63 uniformly during metal oxide formation will provide a desirable compact metal oxide. Preferably, in the case of a $TiO_2$ gate dielectric, the $TiO_2$ thickness is in the range as described previously herein with reference to FIGS. 2A–2C. Typical packing densities for the metal oxide are preferably in the range of about 0.9 to about 1.0. In other words, the ratio of a metal oxide film deposited without the use of ion bombardment versus a metal oxide film deposited using ion bombardment is in the range of about 0.9 to about 1.0.

One skilled in the art will recognize that various commercial components such as electron beam guns and ion beam guns are available for use and modification according to the present invention. All patents and/or references cited herein are incorporated in their entirety as if each were incorporated separately. This invention has been described with reference to illustrative embodiments and is not to be construed in a limiting sense. Various modifications of the illustrative embodiments, as well as additional embodiments of the invention, will be apparent to persons skilled in the art upon reference to this description. As previously indicated herein, preferably, the present invention is particularly beneficial to the formation of gate dielectrics, however, other applications may also benefit therefrom.

What is claimed is:

1. A system for use in the fabrication of a gate structure, the apparatus comprising:

a vacuum chamber including substrate assembly holder adapted to hold a substrate assembly having a surface;

an ozonizer apparatus, the ozonizer apparatus comprising:
   an ozone source, and
   an ozonizer structure proximate the surface of the substrate assembly in the vacuum chamber, the ozonizer structure having openings adapted to direct ozone towards the surface of the substrate assembly;

an evaporation apparatus, the evaporation apparatus comprising:
   a metal oxide source, and an electron beam generation device operable to generate an electron beam that impinges on the metal oxide source to evaporate metal oxide of the metal oxide source for formation of metal oxide on the surface of the substrate assembly; and an ion beam apparatus, the ion beam apparatus comprising:
   an inert gas source operable to provide an inert gas, and
   an ion gun operable to generate an ion beam using the inert gas and directing the ion beam for contact at the surface of the substrate assembly.

2. The system of claim 1, wherein the metal oxide source includes a high purity source material, wherein the high purity source material has a purity that is about. 99.999% or greater.

3. The system of claim 2, wherein the metal oxide source includes material selected from the group consisting of $TiO_2$, $Y_2O_3$, $Al_2O_3$, $ZrO_2$, $HfO_2$, $Y_2O_3$—$ZrO_2$, $ZrSiO_4$, $LaAlO_3$, and $MgAl_2O_4$.

4. The system of claim 3, wherein the metal oxide source is a $TiO_2$ source.

5. The system of claim 1, wherein the ion beam apparatus further comprises a controller operable to delay generation of the ion beam until at least a monolayer of metal oxide is formed using the evaporation apparatus.

6. The system of claim 1, wherein the ozonizer structure is a ring structure having openings adapted to direct ozone uniformly towards the substrate assembly surface.

7. The system of claim 1, wherein the evaporation apparatus further comprises an evaporator controller operable to control the electron beam power such that a deposition rate for metal oxide formation on the surface of the substrate assembly is about 0.1 nm/second to about 0.2 nm/second.

8. The system of claim 1, wherein the ion beam apparatus further comprises an ion beam controller operable to control ion beam density of the ion beam such that the ion beam density is in the range of about 0.5 ma/cm$^2$ to about 1 ma/cm$^2$.

9. The system of claim 1, wherein the ion beam source includes a gas selected from a group consisting of argon, xenon, and krypton.

10. The system of claim 1, wherein the system further comprises a heating device operable to heat the substrate assembly within the range of about 100° C. to about 150° C.

* * * * *